(12) United States Patent
Ono

(10) Patent No.: US 12,356,860 B2
(45) Date of Patent: Jul. 8, 2025

(54) LAMINATED PIEZOELECTRIC ELEMENT

(71) Applicant: TDK Corporation, Tokyo (JP)

(72) Inventor: Shuto Ono, Tokyo (JP)

(73) Assignee: TDK CORPORATION, Tokyo (JP)

( * ) Notice: Subject to any disclaimer, the term of this patent is extended or adjusted under 35 U.S.C. 154(b) by 653 days.

(21) Appl. No.: 17/761,265

(22) PCT Filed: Dec. 11, 2020

(86) PCT No.: PCT/JP2020/046375
§ 371 (c)(1),
(2) Date: Mar. 17, 2022

(87) PCT Pub. No.: WO2021/125097
PCT Pub. Date: Jun. 24, 2021

(65) Prior Publication Data
US 2022/0376163 A1 Nov. 24, 2022

(30) Foreign Application Priority Data
Dec. 16, 2019 (JP) ................. 2019-226628

(51) Int. Cl.
*H10N 30/50* (2023.01)
*H10N 30/87* (2023.01)

(52) U.S. Cl.
CPC ......... *H10N 30/508* (2023.02); *H10N 30/871* (2023.02); *H10N 30/872* (2023.02)

(58) Field of Classification Search
CPC .. H10N 30/508; H10N 30/871; H10N 30/872; H10N 30/50; H10N 30/87; H10N 30/045; H10N 30/20; H10N 30/853
See application file for complete search history.

(56) References Cited

U.S. PATENT DOCUMENTS

2002/0017142 A1* 2/2002 Kitahara ............... B41J 2/1623
73/662
2009/0243440 A1 10/2009 Kimura et al.
2016/0056366 A1 2/2016 Nakamura

FOREIGN PATENT DOCUMENTS

JP 2007-335664 A 12/2007
WO 2008/078487 A1 7/2008
WO 2015/060132 A1 4/2015

OTHER PUBLICATIONS

Feb. 22, 2021 International Search Report issued in International Patent Application No. PCT/JP2020/046375.
(Continued)

*Primary Examiner* — Emily P Pham
(74) *Attorney, Agent, or Firm* — Oliff PLC

(57) ABSTRACT

A multilayer piezoelectric element includes a piezoelectric body containing a piezoelectric ceramic material, a first electrode, and a second electrode. The piezoelectric body includes a first main surface and a second main surface opposing each other. The first electrode includes an external electrode formed on the first main surface. The second electrode includes an internal electrode formed inside the piezoelectric body to oppose the external electrode. The piezoelectric body includes an active region between the external electrode and the internal electrode, and includes an inactive region opposite to the active region with the internal electrode interposed therebetween. A stress received by the piezoelectric body from the external electrode is larger than a stress received by the piezoelectric body from the internal electrode. A polarization direction of the active region is a direction directed from the external electrode to the internal electrode.

12 Claims, 3 Drawing Sheets

(56) References Cited

OTHER PUBLICATIONS

May 17, 2022 International Preliminary Report on Patentability issued in International Patent Application No. PCT/JP2020/046375.

* cited by examiner

LAMINATED PIEZOELECTRIC ELEMENT

TECHNICAL FIELD

The present invention relates to a multilayer piezoelectric element.

BACKGROUND ART

Known multilayer piezoelectric elements include a piezoelectric body containing a piezoelectric ceramic material, and a first electrode and a second electrode that are configured to apply an electric field to the piezoelectric body (for example, refer to Patent Literatures 1 and 2). The piezoelectric body includes a first main surface and a second main surface that oppose each other. The first electrode includes an external electrode formed on the first main surface. The second electrode includes an internal electrode that is formed inside the piezoelectric body to oppose the external electrode.

CITATION LIST

Patent Literature

Patent Literature 1: international Publication WO 2008/078487
Patent Literature 2: international Publication WO 2015/060132

SUMMARY OF INVENTION

Technical Problem

An object of an aspect of the invention is to provide a multilayer piezoelectric element that realizes a large displacement amount and has high reliability.

Solution to Problem

The present inventors conducted thorough research on a multilayer piezoelectric element that realizes a large displacement amount and has high reliability. As a result, the present inventors have newly obtained the following findings, and have accomplished the present invention.

The piezoelectric body is subjected to a polarization treatment. Due to the polarization treatment, a predetermined ion in a crystal structure migrates, and a polarization direction in each domain that exists in the piezoelectric body is aligned. For example, the predetermined ion is a B ion in a perovskite crystal structure expressed by $ABO_X$. In which case, when a total amount of B ions that migrate to a predetermined position is larger, the piezoelectric body is satisfactorily polarized. In a configuration where the piezoelectric body is satisfactorily polarized, piezoelectric characteristics are high. The piezoelectric body in which the B ion migrates to the predetermined position in each domain and polarization is aligned to a predetermined direction is in an appropriate polarization state.

Easiness of migration of the predetermined ion is different depending on a stress applied to the piezoelectric body from another member different from the piezoelectric body. In a configuration where the piezoelectric body includes a portion that receives a stress from one member and a portion that receives a stress from another member, and the stress received from the one member is larger than the stress received from the other member, for example, the predetermined ion has the following migration tendency. The predetermined ion tends not to migrate toward the portion that receives the stress from the one member, and tends to migrate toward the portion that receives the stress from the other member.

Therefore, a multilayer piezoelectric element that realizes the following configuration tends to obtain large polarization. The piezoelectric body includes a plurality of portions in which stresses received from a plurality of members different from the piezoelectric body are different from each other. A polarization direction is set as a direction directed from a portion where a received stress is large toward a portion where a received stress is small. As obtained polarization is larger, the multilayer piezoelectric element realizes a large displacement amount. As the obtained polarization is larger, even in the case of being used under a situation in which a voltage is applied in a direction opposite to the polarization direction, the multilayer piezoelectric element tends not to lose polarization. That is, the multilayer piezoelectric element has high reliability.

A stress received by the piezoelectric body from an electrode may be different depending on a configuration and a making process of an electrode disposed to the piezoelectric body. For example, when the electrode is a sintered metal layer, typically, the electrode is obtained from simultaneous firing with the piezoelectric body. For example, when the electrode is a plated layer, typically, the electrode is Obtained from forming a metal layer on the piezoelectric body using a plating method. For example, the plating method includes a sputtering method, a vapor deposition method, or an electrolytic plating method.

When the electrode is the sintered metal layer, metal materials attract each other in the process of sintering the metal materials, and thus a plurality of holes tends to be formed in the electrode. When the electrode is the plated layer, the electrode is dense, and a hole tends not to be formed in the electrode. Due to the difference in these tendencies, a stress received by the piezoelectric body from the electrode including the sintered metal layer is smaller than a stress received by the piezoelectric body from the electrode including the plated layer.

Therefore, the configuration in which the piezoelectric body includes a plurality of portions where stresses received from a plurality of members different from the piezoelectric body are different can be realized through forming the internal electrode and the external electrode to the piezoelectric body.

A multilayer piezoelectric element according to an aspect includes a piezoelectric body containing a piezoelectric ceramic material, a first electrode, and a second electrode. The piezoelectric body includes a first main surface and a second main surface that oppose each other. The first electrode includes an external electrode formed on the first main surface. The second electrode includes an internal electrode formed inside the piezoelectric body to oppose the external electrode. The piezoelectric body includes an active region between the external electrode and the internal electrode, and includes an inactive region opposite to the active region with the internal electrode interposed therebetween. A stress received by the piezoelectric body from the external electrode is larger than a stress received by the piezoelectric body from the internal electrode. A polarization direction of the active region is a direction directed from the external electrode toward the internal electrode.

In the aspect, the stress received by the piezoelectric body from the internal electrode is smaller than the stress received by the piezoelectric body from the external electrode. The active region between the external electrode and the internal electrode includes a portion that receives a stress from the internal electrode and a portion that receives a stress from the external electrode, and the stresses received by the portions are different as described above. The polarization direction of the active region is the direction directed from the external electrode toward the internal electrode.

Therefore, the aspect realizes the following configuration. The piezoelectric body (active region) includes a plurality of portions in which stresses received from a plurality of members different from the piezoelectric body are different from each other. The polarization direction is set as a direction directed from a portion where a stress received from one member of the plurality of members is large toward a portion where a stress received from another member of the plurality of members is small.

Consequently, the aspect realizes a large displacement amount and has high reliability.

In the aspect, a coverage rate of the external electrode may be larger than a coverage rate of the internal electrode. A configuration in which the coverage rate of the external electrode is larger than the coverage rate of the internal electrode realizes a configuration where the stress received by the piezoelectric body from the external electrode is larger than the stress received by the piezoelectric body from the internal electrode in a simple and reliable manner.

In the aspect, the piezoelectric body may include a first end surface and a second end surface opposing each other in a second direction intersecting a first direction in which the first main surface and the second main surface oppose each other. The internal electrode may be exposed to the first end surface and may be separated from the second end surface in the second direction. The external electrode may be separated from the first end surface in the second direction. An interval between the internal electrode and the second end surface in the second direction and an interval between the external electrode and the first end surface in the second direction may be different from each other. In which case, deformation of the multilayer piezoelectric element (piezoelectric body) that occurs due to a polarization treatment, and displacement of the multilayer piezoelectric element (piezoelectric body) that occurs due to driving are balanced in a satisfactory manner.

In the aspect, the second electrode may include an external electrode formed on the second main surface and electrically connected to the internal electrode. The external electrode included in the second electrode may be separated from the second end surface in the second direction. An interval between the external electrode included in the second electrode and the second end surface in the second direction may be larger than the interval between the internal electrode and the second end surface in the second direction. In which case, deformation of the multilayer piezoelectric element (piezoelectric body) that occurs due to a polarization treatment, and displacement of the multilayer piezoelectric element (piezoelectric body) that occurs due to driving are balanced in a satisfactory manner.

Advantageous Effects of Invention

The aspect of the invention provides a multilayer piezoelectric element that realizes a large displacement amount and has high reliability.

DESCRIPTION OF EMBODIMENTS

Figure 1:
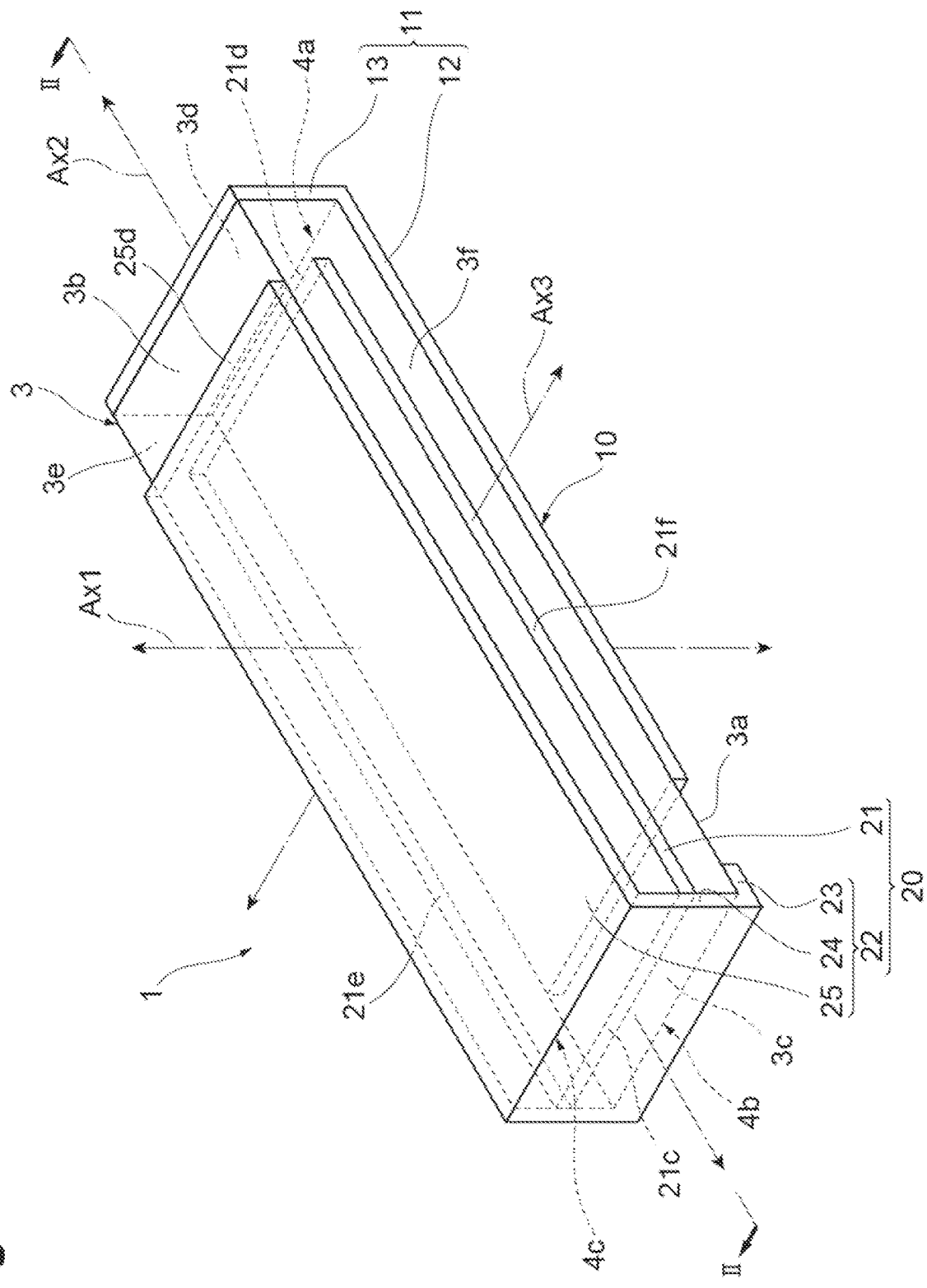
FIG. 1 is a perspective view illustrating a multilayer piezoelectric element according to an embodiment.

Hereinafter, embodiments of the present invention will be described in detail with reference to the accompanying drawings. In the following description, the same elements or elements having the same functions will be denoted with the same reference numerals and overlapped explanation will be omitted.

Figure 2:
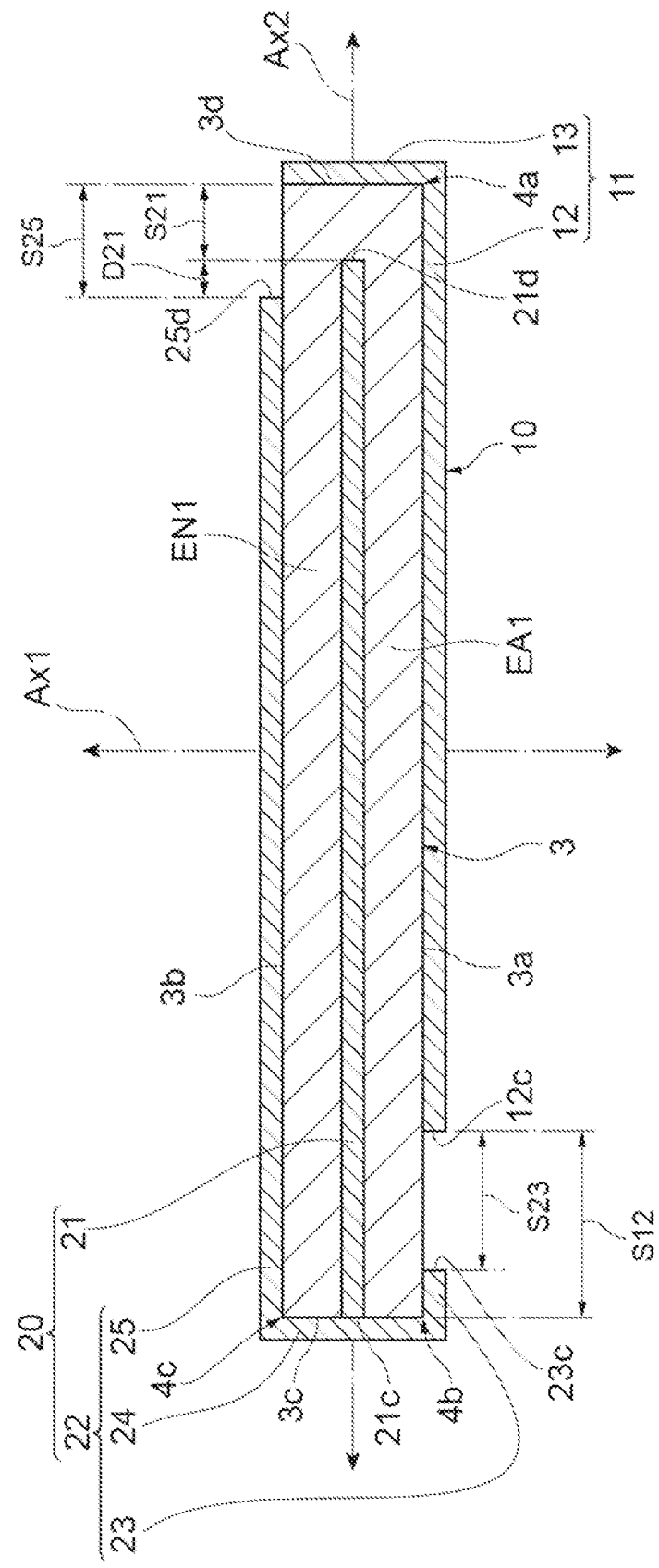
FIG. 2 is a cross-sectional view taken along line LI-II in FIG. 1.

A configuration of a multilayer piezoelectric element 1 according to the present embodiment will be described with reference to FIG. 1 and FIG. 2. FIG. it is a perspective view illustrating the multilayer piezoelectric element according to the present embodiment. FIG. 2 is a cross-sectional view taken along line II-II in FIG. 1.

The multilayer piezoelectric element 1 includes a piezoelectric body 3, and a first electrode 10 and a second electrode 20 disposed at the piezoelectric body 3. The first electrode 10 and the second electrode 20 are configured to apply an electric field to the piezoelectric body 3. For example, the multilayer piezoelectric element 1 is used in a hard disk drive. For example, the multilayer piezoelectric element 1 is used in a second actuator other than a voice coil motor provided in a dual actuator hard disk drive.

The piezoelectric body 3 contains a piezoelectric ceramic material. For example, the piezoelectric body 3 is constituted by a sintered body of a piezoelectric ceramic material. For example, the piezoelectric ceramic material includes PZT [$Pb(Zr,Ti)O_3$], PT ($PbTiO_3$), PLZT [$(Pb,La)(Zr,Ti)O_3$], or barium titanate ($BaTiO_3$). The piezoelectric ceramic materials are perovskite oxides (general formula: $ABO_X$).

The piezoelectric body 3 has a rectangular parallelepiped shape. The piezoelectric body 3 includes a first main surface 3a and a second main surface 3b that oppose each other. The first main surface 3a and the second main surface 3b oppose each other in a first direction Ax1. The first main surface 3a and the second main surface 3h are parts of an outer surface of the piezoelectric body 3. For example, the piezoelectric body 3 has a configuration where a plurality of piezoelectric layers are laminated. For example, the piezoelectric body 3 is constituted by a ceramic green sheet sintered body containing a piezoelectric ceramic material. A direction in which the piezoelectric layers are laminated is, for example, a direction along the first direction Ax1. In an actual piezoelectric body 3, the piezoelectric layers are integrated to a certain extent in which a boundary between the piezoelectric layers cannot be visually recognized. For example, a length of the piezoelectric body 3 along the first direction Ax1 is approximately 0.05 mm. For example, the first direction Ax1 is a thickness direction of the piezoelectric body 3. The rectangular parallelepiped shape includes a rectangular parallelepiped shape in which corners and ridges are chamfered, or a rectangular parallelepiped shape in which corners and ridges are rounded.

The piezoelectric body 3 includes a first end surface 3c and a second end surface 3d that oppose each other. The first end surface 3c and the second end surface 3d oppose each other in a second direction Ax2 intersecting the first direction Ax1. The first end surface 3c and the second end surface 3d are parts of the outer surface of the piezoelectric body 3. For example, the second direction Ax2 is a longitudinal direction of the piezoelectric body 3. A length of the piezoelectric body 3 along the second direction Ax2 is approximately 0.65 mm.

The piezoelectric body 3 includes a first side surface 3e and a second side surface 3f that oppose each other. The first side surface 3e and the second side surface 3f oppose each other in a third direction Ax3 intersecting the first direction Ax1 and the second direction Ax2. The first side surface 3e and the second side surface 3f are parts of the outer surface of the piezoelectric body 3. For example, the third direction Ax3 is a lateral direction of the piezoelectric body 3. For example, a length of the piezoelectric body 3 along the third direction Ax3 is approximately 0.25 mm.

The first main surface 3a and the second main surface 3b extend in the second direction Ax1 to couple the first end surface 3c and the second end surface 3d. The first main surface 3a and the second main surface 3b extend in the third direction Ax3 to couple the first side surface 3e and the second side surface 3f.

The first end surface 3c and the second end surface 3d extend in the first direction Ax1 to couple the first main surface 3a and the second main surface 3b. The first end surface 3c and the second end surface 3d extend in the third direction Ax3 to couple the first side surface 3e and the second side surface 3f.

The first side surface 3e and the second side surface 3f extend in the second direction Ax1 to couple the first end surface 3c and the second end surface 3d. The first side surface 3e and the second side surface 3f extend in the first direction Ax1 to couple the first main surface 3a and the second main surface 3b.

The first electrode 10 includes an external electrode. For example, the first electrode 10 includes a first external electrode 11. The first external electrode 11 is formed on the outer surface of the piezoelectric body 3, The first external electrode 11 includes a first electrode portion 12 and a second electrode portion 13, The first electrode portion 12 is disposed on the first main surface 3a, and the second electrode portion 13 is disposed on the second end surface 3d. The first electrode portion 12 and the second electrode portion 13 are integrally formed on the outer surface of the piezoelectric body 3. The first electrode portion 12 and the second electrode portion 13 are coupled to each other at a corner 4a defined from the first main surface 3a and the second end surface 3d. The first electrode portion 12 extends between an end edge of the first side surface 3e and an end edge of the second side surface 3f, on the first main surface 3a. The first electrode portion 12 extends from an end edge of the second end surface 3d toward an end edge of the first end surface 3c, on the first main surface 3a. The first electrode portion 12 is separated from the first end surface 3c. The first electrode portion 12 includes an electrode end 12c located near the first end surface 3c. The electrode end 12c is separated from the first end surface 3c. An interval S12 between the electrode end 12c and the first end surface 3c in the second direction Ax1 is, for example, 90 to 250 nm. The first external electrode 11 is in contact with the piezoelectric body 3. The first electrode portion 12 is in contact with the first main surface 3a.

The second electrode portion 13 is disposed to cover the entirety of the second end surface 3d. The first electrode 10 is not disposed on either the first side surface 3e or the second side surface 3f. The second electrode portion 13 is in contact with the second end surface 3d.

The second electrode 20 includes an internal electrode 211. The internal electrode 21 is disposed inside the piezoelectric body 3. In the present embodiment, the multilayer piezoelectric element 1 includes only the internal electrode 21 as an internal electrode disposed inside the piezoelectric body 3. The internal electrode 21 is formed inside the piezoelectric body 3 to oppose the first electrode portion 12 of the first external electrode 11 in the first direction Ax1. For example, an intergyral between the internal electrode 21 and the first electrode portion 12 in the first direction Ax1*l* is 5 to 100 μm. For example, the internal electrode 21 has an approximately rectangular shape when viewed from the first direction Ax1. The internal electrode 21 is in contact with the piezoelectric body 3.

The internal electrode 21 is disposed inside the piezoelectric body 3 to extend from the first end surface 3c toward the second end surface 3d along the second direction Ax2. The internal electrode 21 is exposed to the first end surface 3c but is not exposed to the second end surface 3d. The internal electrode 21 is separated from the second end surface 3d in the second direction Ax2. The internal electrode 21 includes a pair of electrode end surface 21c and electrode end surface 21d that oppose each other in the second direction Ax2. The electrode end surface 21c is exposed to the first end surface 3c of the piezoelectric body 3. The electrode end surface 21d is not exposed to the second end surface 3d of the piezoelectric body 3, and is separated from the second end surface 3d.

For example, an interval S21 between the electrode end surface 21d and the second end surface 3d in the second direction Ax2 is 10 to 80 nm, Since the electrode end surface 21d and the second end surface 3d are separated from each other, the multilayer piezoelectric element 1 prevents short-circuiting between the internal electrode 21 and the first electrode 10.

In the present embodiment, the interval S21 and the interval S12 are different from each other. A configuration in which the interval S21 and the interval S12 are different from each other reduces a stress that occurs in the piezoelectric body 3 due to a polarization treatment. Therefore, deformation of the multilayer piezoelectric element 1 (piezoelectric body 3) that occurs due to the polarization treatment, and displacement of the multilayer piezoelectric element 1 (piezoelectric body 3) that occurs due to driving are balanced in a satisfactory manner.

The internal electrode 21 is disposed inside the piezoelectric body 3 to extend between the first side surface 3e and the second side surface 3f along the third direction Ax3. The internal electrode 21 includes a pair of electrode side surface 21e and electrode side surface 21f that oppose each other in the third direction Ax3. In the present embodiment, the electrode side surface 21e is exposed to the first side surface 3e and the electrode side surface 21f is exposed to the second side surface 3f.

For example, the internal electrode 21 is formed from simultaneous firing with the piezoelectric body 3. For example, the internal electrode 21 is made of Pt. In which case, the internal electrode 21 is constituted by a sintered body of conductive paste containing particles made of Pt. The internal electrode 21 may be made of a conductive material other than Pt. Examples of the conductive material include Ag, Pd. Au, Cu, Ni, or alloys thereof. The internal electrode 21 may be constituted by a sintered body of conductive paste containing the conductive material. For example, a thickness of the internal electrode 21 is 0.2 to 3 μm.

The second electrode 20 includes an external electrode. For example, the second electrode 20 includes a second external electrode 22. The second external electrode 22 is formed on the outer surface of the piezoelectric body 3. The second external electrode 22 includes a third electrode portion 23, a fourth electrode portion 24, and a fifth electrode portion 25. The third electrode portion 23 is disposed on the first main surface 3a. The fourth electrode portion 24 is disposed on the first end surface 3c, The fifth electrode portion 25 is disposed on the second main surface 3b. The third electrode portion 23, the fourth electrode portion 24, and the fifth electrode portion 25 are integrally formed on the outer surface. The second external electrode 22 is in contact with the piezoelectric body 3. The third electrode portion 23 is in contact with the first main surface 3a.

The third electrode portion 23 and the fourth electrode portion 24 are coupled to each other at a corner 4h defined by the first main surface 3a and the first end surface 3c. The fourth electrode portion 24 and the fifth electrode portion 25 are coupled to each other at a corner 4c defined by the first end surface 3c and the second main surface 3b. The third electrode portion 23 extends between an end edge of the first side surface 3e and an end edge of the second side surface 3f, on the first main surface 3a. The third electrode portion 23 extends from an end edge of the first end surface 3c toward the first electrode portion 12, on the first main surface 3a. The third electrode portion 23 is separated from the first electrode portion 12. The third electrode portion 23 includes an electrode end 23c located near the first electrode portion 12. The electrode end 23c is separated from the electrode end 12c. For example, an interval S23 between the electrode end 23c and the electrode end 12c in the second direction Ax2 is 50 to 200 mm A configuration in which the interval S23 is within the range of 50 to 200 nm prevent short-circuiting between the first external electrode 11 and the second external electrode 22, and controls releasing of crystal particles from the piezoelectric body 3.

The fourth electrode portion 24 is disposed to cover the entirety of the first end surface 3c, The fourth electrode portion 24 is in contact with the first end surface 3c. The fifth electrode portion 25 extends between an end edge of the first side surface 3e and an end edge of the second side surface 3f, on the second main surface 3b. The fifth electrode portion 25 extends from an end edge of the first end surface 3c toward an end edge of the second end surface 3d along the second direction Ax2, on the second main surface 3b. The fifth electrode portion 25 is separated from the second end surface 3d. The fifth electrode portion 25 includes an electrode end 25d located near the second end surface 3d. The electrode end 25d is separated from the second end surface 3d. For example, an interval S25 between the electrode end 25d and the second end surface 3d in the second direction Ax2 is 90 to 200 nm. A configuration in which the interval S25 is within the range of 90 to 200 nm prevents short-circuiting between the first external electrode 11 and the second external electrode 22, and controls releasing of crystal particles from the piezoelectric body 3. The fifth electrode portion 25 is in contact with the second main surface 3b.

In the present embodiment, the interval S2.5 is larger than the interval S21. A configuration in which the interval S25 is larger than the interval S21 balances stresses existing inside the piezoelectric body 3. The configuration in which the interval S25 is larger than the interval S21 balances deformation of the multilayer piezoelectric element 1 (piezoelectric body 3) that occurs due to the polarization treatment and displacement of the multilayer piezoelectric element 1 (piezoelectric body 3) that occurs due to driving, in a satisfactory manner.

In the second direction Ax2, a position of the electrode end surface 21d of the internal electrode 21 is closer to the second end surface 3d, as compared with a position of the electrode end 25d of the fifth electrode portion 25. For example, a distance D21 between the position of the electrode end surface 21d and the position of the electrode end 25d in the second direction Ax1 is 10 to 190 nm.

The fourth electrode portion 24 is disposed to cover the entirety of the electrode end surface 21c of the internal electrode 21 that is exposed to the first end surface 3c. The internal electrode 21 is coupled to the fourth electrode portion 24 at the first end surface 3c. The internal electrode 21 is electrically connected to the second external electrode 22. The fifth electrode portion 25 opposes the internal electrode 21 in the first direction Ax1. For example, an interval between the fifth electrode portion 25 of the second external electrode 22 and the internal electrode 21 in the first direction Ax1 is 5 to 100 µm. The second electrode 20 is not disposed on either the first side surface 3e or the second side surface 3f. In the present embodiment, the first side surface 3e and the second side surface 3f are exposed from the first electrode 10 and the second electrode 20.

For example, the first external electrode 11 and the second external electrode 22 include an Ni—Cr alloy layer and an Au layer that are laminated, respectively, in which case, the Ni—Cr alloy layer is formed on the piezoelectric body 3, and the Au layer is formed on the Ni—Cr alloy layer. The Ni—Cr alloy layer is a lower layer and the Au layer is an upper layer. The first external electrode 11 and the second external electrode 22 have Ni—Cr/Au laminated structures, respectively. For example, the first external electrode 11 and the second external electrode 22 may have a single layer structure, respectively. In which case, the first external electrode 11 and the second external electrode 22 may be, for example, an Ni—Cr alloy layer, an Au layer, a Cr layer, or an Ni layer. Any one of the first external electrode 11 and the second external electrode 22 may have an Ni—Cr/Au laminated structure, and the other of the first external electrode 11 and the second external electrode 22 may have a single layer structure. The first external electrode 11 and the second external electrode 22 may be formed, for example, using a plating method. The plating method includes a sputtering method, a vapor deposition method, or an electrolytic plating method. In the present embodiment, the first external electrode 11 and the second external electrode 22 are plated layers, respectively.

In a configuration where the first external electrode 11 and the second external electrode 22 have the laminated structure, for example, a thickness of the Ni—Cr alloy layer is 20 to 400 nm, and a thickness of the Au layer is 50 to 200 nm. In a configuration where the first external electrode 11 and the second external electrode 22 have the single layer structure, for example, the thicknesses of the first external electrode 11 and the second external electrode 22 are 70 to 600 nm. In the present embodiment, the piezoelectric body 3 is sandwiched by the first external electrode 11 and the second external electrode 22. The configuration in which the first external electrode 11 and the second external electrode 22 sandwich the piezoelectric body 3 reduces, for example, deformation of the piezoelectric body 3.

The first external electrode 11 and the internal electrode 21 of the second electrode 20 are configured to apply an electric field to the piezoelectric body 3. The second external electrode 22 of the second electrode 20 and the internal electrode 21 of the second electrode 20 are electrically connected to each other. Therefore, the second external electrode 22 and the internal electrode 21 tend not to be configured to apply an electric field to the piezoelectric body 3. The multilayer piezoelectric element 1 includes the first external electrode 11 and internal electrode 21 as a pair of electrodes configured to apply an electric field to the piezoelectric body 3.

In the multilayer piezoelectric element 1, the piezoelectric body 3 includes an active region EA1. The active region EA1 is located between the first external electrode 11 and the internal electrode 21. The active region EA1 displaces in response to an electric field applied to the multilayer piezoelectric element 1. In the present embodiment, the active region EA1 is located between the first electrode portion 12 of the first external electrode 11 and the internal electrode 21. The piezoelectric body 3 includes an inactive region EN1. The inactive region EN1 is located on a side opposite to the active region EA1 with the internal electrode 21 interposed therebetween. The inactive region EN1 is located between the internal electrode 21 and the second external electrode 22. The active region EA1 and the inactive region EN1 are located on both sides of the one internal electrode 21.

In the second electrode 20, for example, the internal electrode 21 is made of Pt or the like as described above. Therefore, hardness of the internal electrode 21 is low. The internal electrode 21 is simultaneously fired with the piezoelectric body 3. Therefore, a stress received by the piezoelectric body 3 from the internal electrode 21 is relatively small, Consequently, the internal electrode 21 tends not to impede displacement of the piezoelectric body 3. A displacement amount of the active region EA1 near the internal electrode 21 tends to be relatively large.

In the first electrode 10, the first external electrode 11 is constituted from an Ni—Cr alloy layer. Therefore, hardness of the first external electrode 11 is high. The first external electrode 11 is formed using the plating method after the piezoelectric body 3 is fired. Therefore, a stress received by the piezoelectric body 3 from the first external electrode 11 is relatively large. Consequently, the first external electrode 11 tends to impede displacement of the piezoelectric body 3. A displacement amount of the active region EA1 near the first external electrode 11 tends to be small.

In the present embodiment, a stress received by the piezoelectric body 3 from the first external electrode 11 is larger than a stress received by the piezoelectric body 3 from the internal electrode 21. In the present embodiment, the internal electrode 21 is the sintered metal layer. In the present embodiment, a configuration in which the piezoelectric body 3 includes a plurality of portions where stresses received from a plurality of members different from the piezoelectric body 3 are different is realized through forming the internal electrode 21 and the first external electrode 11 to the piezoelectric body 3.

A predetermined ion that migrates inside a crystal structure due to the polarization treatment tends to migrate from the first external electrode 11 toward the internal electrode 21 than from the internal electrode 21 toward the first external electrode 11. Therefore, in a process of making the multilayer piezoelectric element 1, an electric field is applied to the piezoelectric body 3 such that a polarization direction of the active region EA1 is a direction directed from the first external electrode 11 toward the internal electrode 21. For example, the predetermined ion is a B-site positive ion in the perovskite oxide (general formula: $ABO_x$).

For example, the polarization treatment is performed at an ordinary temperature. The polarization treatment may be performed, for example, under a temperature environment of approximately 80° C. to 150° C. other than the ordinary temperature. That is, the piezoelectric body 3 may be heated. In a case where the polarization treatment is performed in a state in which the piezoelectric body 3 is being heated, when a polarization electric field is changed from an application state to a non-application state, a temperature of the piezoelectric body 3 may be an ordinary temperature. In which case, polarization deterioration is reduced. For example, the polarization deterioration is caused by aging or driving of the multilayer piezoelectric element 1. When the multilayer piezoelectric element 1 is driven, in a state in which the first electrode 10 including the first external electrode 11 is set as a positive electrode, and the second electrode 20 including the internal electrode 21 is set as a negative electrode, an electric field is applied to the multilayer piezoelectric element 1 (piezoelectric body 3).

In the present embodiment, a stress received by the piezoelectric body 3 from the internal electrode 21 is smaller than a stress received by the piezoelectric body 3 from the first external electrode 11. The active region EA1 between the first external electrode 11 and the internal electrode 21 includes a portion that receives a stress from the internal electrode 21 and a portion that receives a stress from the first external electrode 11, and the stresses received by the portions are different from each other as described above. The polarization direction of the active region EA1 is the direction directed from the first external electrode 11 toward the internal electrode 21.

Therefore, in the present embodiment, the piezoelectric body 3 (active region EA1) includes a plurality of portions in which stresses received from a plurality of members different from the piezoelectric body 3 are different from each other. The polarization direction is set as a direction directed from a portion where a stress received from one member of the plurality of members is large toward a portion where a stress received from another member of the plurality of members is small. That is, the polarization direction is set as a direction directed from a portion where a stress received from the first external electrode 11 is large toward a portion where a stress received from the internal electrode 21 is small.

Consequently, the multilayer piezoelectric element 1 exhibits a large displacement amount and has high reliability.

For example, the internal electrode 21 of the second electrode 20 is formed from simultaneous firing with the piezoelectric body 3. In which case, the internal electrode 21 is formed through a sintering reaction. As a result of occurrence of the sintering reaction, regions that are not covered with the internal electrode 21 randomly occur in the piezoelectric body 3 (piezoelectric layer adjacent to the internal electrode 21). That is, openings are randomly formed in the internal electrode 21. Consequently, a coverage rate of the internal electrode 21 tends to decrease.

The first external electrode 11 of the first electrode 10 is formed, for example, using the plating method after the piezoelectric body 3 is fired. In which case, a region that is not covered with the first external electrode 11 tends not to occur in a region of the piezoelectric body 3 where the first external electrode 11 is formed. Consequently, a coverage rate of the first external electrode 11 tends to increase.

In the present embodiment, the coverage rate of the first external electrode 11 is larger than the coverage rate of the internal electrode 21. For example, the coverage rate of the first external electrode 11 is 95 to 100, and the coverage rate of the internal electrode 21 is 60 to 95. Therefore, a configuration in which the coverage rate of the first external electrode 11 is larger than the coverage rate of the internal electrode 21 realizes a configuration in which the stress received by the piezoelectric body 3 from the first external electrode 11 is larger than the stress received by the piezoelectric body 3 from the internal electrode 21 in a simple and reliable manner.

Hereinbefore, the embodiment of the invention has been described, but the invention is not limited to the above-described embodiment, and various modifications can be made in a range not departing from the gist of the invention.

EXAMPLES

Next, examples of the present invention will be described. The present invention is not limited to the following examples.

Example 1

(Preparation of Laminated Piezoelectric Element)

A process of preparing the multilayer piezoelectric element according to Example 1 is as follows.

First, a green sheet containing a piezoelectric ceramic material is prepared. The piezoelectric ceramic material includes PIT.

Next, an electrode pattern for obtaining an internal electrode is formed in the green sheet. The electrode pattern is formed through applying conductive paste containing Pt on the green sheet.

Next, a laminate green is formed. The laminate green is a structure in which a green sheet where the electrode pattern is formed and a green sheet where the electrode pattern is not formed are laminated.

Next, the laminate green is fired. Thus, a piezoelectric substrate is obtained. The piezoelectric substrate includes an electrode film. The electrode film constitutes the internal electrode, A thickness of the piezoelectric substrate is 0.05 mm. A thickness of the electrode film is approximately 1 μm.

Next, the piezoelectric substrate is cut into strips. Next, a laminated electrode film is formed on an outer surface of the strip-shaped piezoelectric substrate. The laminated electrode film is formed using a sputtering method. The laminated electrode film includes a lower-layer electrode film made of an Ni—Cr alloy, and an upper-layer electrode film made of Au. The upper-layer electrode film is formed on the lower-layer electrode film. That is, the laminated electrode film has an Ni—Cr/Au laminated structure. A thickness of the electrode film for the lower layer is approximately 100 nm. A thickness of the electrode film for the upper layer is approximately 100 nm. The laminated electrode film is an electrode film that constitutes the first external electrode and the second external electrode. That is, the laminated electrode film includes an electrode film constituting the first external electrode and an electrode film constituting the second external electrode that are separated from each other. The electrode film constituting the second external electrode is connected to the electrode film (electrode film located inside the piezoelectric substrate) constituting the internal electrode.

After forming the laminated electrode film, the piezoelectric substrate is subjected to a polarization treatment. In the polarization treatment, the electrode film constituting the first external electrode is set as a positive electrode, the electrode film constituting the second external electrode is set as a negative electrode, and an electric filed is applied to the piezoelectric substrate. The polarization treatment is performed at an ordinary temperature.

After the polarization treatment, the strip-shaped piezoelectric substrate is cut. Through the above-described processes, a multilayer piezoelectric element is obtained. The multilayer piezoelectric element has a size of approximately 0.65 mm×0.25 mm×0.05 mm.

(Evaluation of Element Characteristics)

Evaluation of element characteristics was performed by the following process.

A magnitude of polarization (P [μC/cm$^2$]) in twenty multilayer piezoelectric elements obtained through the above-described preparation process is measured. In which case, an AC electric field (V [kV/mm]) is applied to the multilayer piezoelectric element. In a state in which the first external electrode is set as a positive electrode and the second external electrode is set as a negative electrode, an AC electric field is applied to the multilayer piezoelectric element. Measurement is performed at an ordinary temperature.

Figure 3:
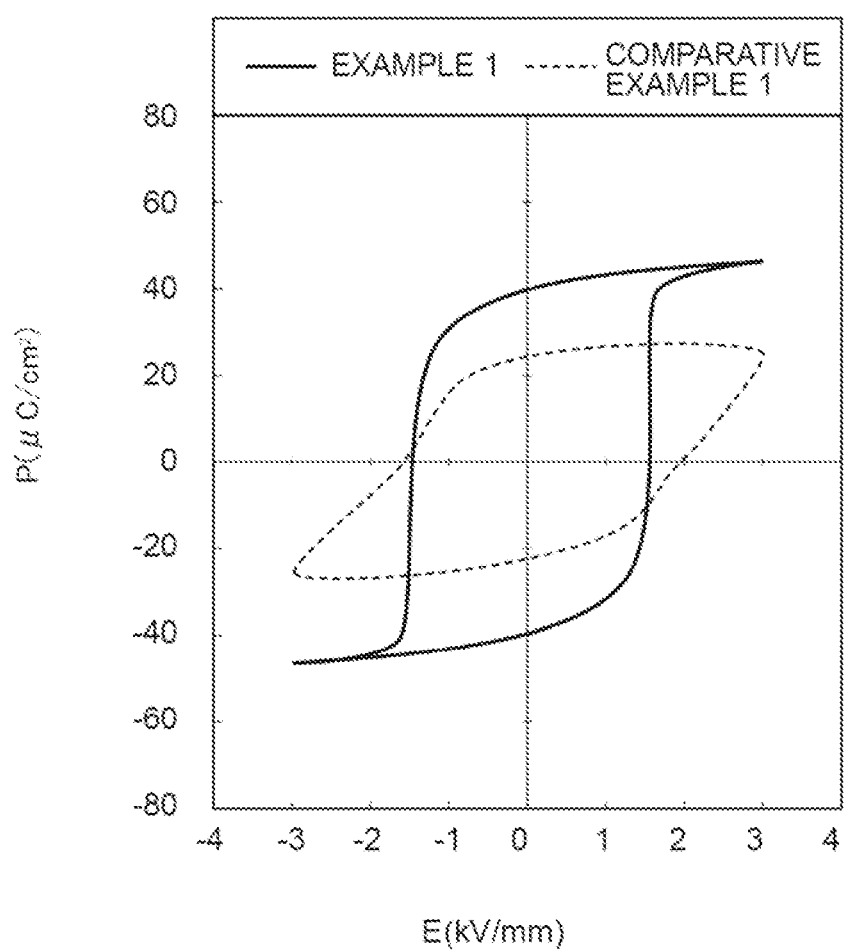
FIG. 3 is a diagram illustrating a relationship between an electric field and polarization.

Measurement results are shown in FIG. 3. FIG. 3 is a diagram illustrating a relationship between the electric field and the polarization. Example 1 obtains larger polarization as compared with Comparative Example 1 to be described later. In Example 1, piezoelectric characteristics in the twenty multilayer piezoelectric elements are also measured. In measurement of the piezoelectric characteristics, an impedance analyzer is used. From results of measurement, it could be seen that a difference in the piezoelectric characteristics between the twenty multilayer piezoelectric elements is within approximately 5%.

(Evaluation of Reliability)

Evaluation of reliability was performed by the following process.

A driving test is performed on ten multilayer piezoelectric elements obtained through the above-described preparation process. In the driving test, a rectangular wave voltage (alternating voltage) having a frequency of 500 Hz is applied to each of the multilayer piezoelectric elements under an environment of 60° C. A peak value of the applied voltage is ±20 V. In a state in which the first external electrode is set as a positive electrode and the second external electrode is set as a negative electrode, the above-described voltage is applied to the multilayer piezoelectric element. Piezoelectric characteristics before and after the driving test for 500 hours are measured, and a variation in the piezoelectric characteristics after the driving test is determined.

From a result of determination, it could be seen that a variation in the piezoelectric characteristics in each of the ten multilayer piezoelectric elements before and after the driving test is within 2%.

Comparative Example 1

(Preparation of Laminated Piezoelectric Element)

A process of preparing a multilayer piezoelectric element according to Comparative Example 1 is as follows.

In Comparative Example 1, the multilayer piezoelectric element is prepared through the same process as in Example 1 except for polarization treatment conditions. In the polarization treatment, the electrode film constituting the first external electrode is set as a negative electrode, the electrode film constituting the second external electrode is set as a positive electrode, and an electric field is applied to the piezoelectric substrate. The polarization treatment is performed at an ordinary temperature.

(Evaluation of Element Characteristics)

Evaluation of element characteristics was performed by the following process.

A magnitude of polarization (P [μC/cm$^2$]) in twenty multilayer piezoelectric elements obtained through the above-described preparation process is measured in a similar manner as in evaluation of the element characteristics in Example 1. In which case, an AC electric field (V [kV/mm]) is also applied to the multilayer piezoelectric element. In a state in which the first external electrode is set as a positive electrode and the second external electrode is set as a negative electrode, an AC electric field is applied to the multilayer piezoelectric element. Measurement is performed at an ordinary temperature.

Measurement results are shown in FIG. 3. Comparative Example 1 obtains small polarization as compared with Example 1. Even in Comparative Example 1, piezoelectric characteristics in the twenty multilayer piezoelectric elements are also measured. In measurement of the piezoelectric characteristics, an impedance analyzer is used. From results of measurement, it could be seen that a difference in the piezoelectric characteristics between the twenty multilayer piezoelectric elements is within approximately 15%.

(Evaluation of Reliability)

Evaluation of reliability was performed by the following process.

A driving test is performed on ten multilayer piezoelectric elements obtained through the above-described preparation process in a similar manner as in evaluation of reliability in Example 1. In the driving test, in a state in which the first external electrode is set as a positive electrode and the second external electrode is set as a negative electrode, the above-described voltage is applied to the multilayer piezoelectric element. Piezoelectric characteristics before and after the driving test for 500 hours are measured, and a variation in the piezoelectric characteristics after the driving test is determined.

From a result of determination, it could be seen that piezoelectric characteristics of each of the ten multilayer piezoelectric elements after the driving test are lowered by 15% to 20% as compared with piezoelectric characteristics of each of the ten multilayer piezoelectric elements before the driving test.

INDUSTRIAL APPLICABILITY

The present invention may be used for a multilayer piezoelectric element.

REFERENCE SIGNS LIST

1: multilayer piezoelectric element, 3: piezoelectric body, 3*a*: first main surface, 3*b*: second main surface, 3*c*: first end surface, 3*d*: second end surface, 10: first electrode, 11: first external electrode, 20: second electrode, 21: internal electrode, 22: second external electrode, Ax1: first direction, Ax2: second direction, EA1: active region, EN1: inactive region.

The invention claimed is:

1. A multilayer piezoelectric element, comprising:
a piezoelectric body containing a piezoelectric ceramic material and including a first main surface and a second main surface that oppose to each other;
a first electrode including an external electrode formed on the first main surface; and
a second electrode including an internal electrode formed inside the piezoelectric body to oppose the external electrode,
wherein the piezoelectric body includes an active region between the external electrode and the internal electrode, and includes an inactive region opposite to the active region with the internal electrode interposed therebetween,
a stress received by the piezoelectric body from the external electrode is larger than a stress received by the piezoelectric body from the internal electrode, and
a polarization direction of the active region is a direction directed from the external electrode to the internal electrode.

2. The multilayer piezoelectric element according to claim 1,
wherein a coverage rate of the external electrode is larger than a coverage rate of the internal electrode.

3. The multilayer piezoelectric element according to claim 2,
wherein the piezoelectric body further includes a first end surface and a second end surface opposing each other in a second direction intersecting a first direction in which the first main surface and the second main surface oppose each other,
the internal electrode is exposed to the first end surface and is separated from the second end surface in the second direction,
the external electrode is separated from the first end surface in the second direction, and
an interval between the internal electrode and the second end surface in the second direction and an interval between the external electrode and the first end surface in the second direction are different from each other.

4. The multilayer piezoelectric element according to claim 3,
wherein the second electrode further includes an external electrode formed on the second main surface and electrically connected to the internal electrode,
the external electrode included in the second electrode is separated from the second end surface in the second direction,
an interval between the external electrode included in the second electrode and the second end surface in the second direction is larger than the interval between the internal electrode and the second end surface in the second direction.

5. The multilayer piezoelectric element according to claim 1,
wherein the piezoelectric body further includes a first end surface and a second end surface opposing each other in a second direction intersecting a first direction in which the first main surface and the second main surface oppose each other,
the internal electrode is exposed to the first end surface and is separated from the second end surface in the second direction,
the external electrode is separated from the first end surface in the second direction, and
an interval between the internal electrode and the second end surface in the second direction and an interval between the external electrode and the first end surface in the second direction are different from each other.

6. The multilayer piezoelectric element according to claim 5,
wherein the second electrode further includes an external electrode formed on the second main surface and electrically connected to the internal electrode,
the external electrode included in the second electrode is separated from the second end surface in the second direction,
an interval between the external electrode included in the second electrode and the second end surface in the second direction is larger than the interval between the internal electrode and the second end surface in the second direction.

7. A multilayer piezoelectric element, comprising:
a piezoelectric body containing a piezoelectric ceramic material and including a first main surface and a second main surface that oppose each other;
a first electrode including a first external electrode formed on the first main surface; and
a second electrode including an internal electrode formed inside the piezoelectric body to oppose the first external electrode, and a second external electrode formed on the second main surface and electrically connected to the internal electrode,
wherein the piezoelectric body includes an active region between the first external electrode and the internal electrode, and includes an inactive region on a side opposite to the active region with the internal electrode interposed therebetween and between the second external electrode and the internal electrode,
a stress received by the piezoelectric body from the first external electrode is larger than a stress received by the piezoelectric body from the internal electrode, and
a polarization direction of the active region is a direction directed from the first external electrode to the internal electrode.

8. The multilayer piezoelectric element according to claim 7,
a coverage rate of the first external electrode to the piezoelectric body is larger than a coverage rate of the internal electrode to a piezoelectric layer constituting piezoelectric body.

9. The multilayer piezoelectric element according to claim 8,
wherein the piezoelectric body further includes a first end surface and a second end surface opposing each other in a second direction intersecting a first direction in which the first main surface and the second main surface oppose each other,
the internal electrode is exposed to the first end surface and is separated from the second end surface in the second direction,
the first external electrode is separated from the first end surface in the second direction, and
an interval between the internal electrode and the second end surface in the second direction and an interval between the first external electrode and the first end surface in the second direction are different from each other.

10. The multilayer piezoelectric element according to claim 9,
wherein the second external electrode is separated from the second end surface in the second direction, and
an interval between the second external electrode and the second end surface in the second direction is larger than the interval between the internal electrode and the second end surface in the second direction.

11. The multilayer piezoelectric element according to claim 7,
wherein the piezoelectric body further includes a first end surface and a second end surface opposing each other in a second direction intersecting a first direction in which the first main surface and the second main surface oppose each other,
the internal electrode is exposed to the first end surface and is separated from the second end surface in the second direction,
the first external electrode is separated from the first end surface in the second direction, and
an interval between the internal electrode and the second end surface in the second direction and an interval between the first external electrode and the first end surface in the second direction are different from each other.

12. The multilayer piezoelectric element according to claim 11,
wherein the second external electrode is separated from the second end surface in the second direction, and
an interval between the second external electrode and the second end surface in the second direction is larger than the interval between the internal electrode and the second end surface in the second direction.

* * * * *